(12) United States Patent
Lim et al.

(10) Patent No.: US 8,115,238 B2
(45) Date of Patent: Feb. 14, 2012

(54) MEMORY DEVICE EMPLOYING MAGNETIC DOMAIN WALL MOVEMENT

(75) Inventors: Chee-kheng Lim, Yongin-si (KR); Eun-sik Kim, Yongin-si (KR); In-jun Hwang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 958 days.

(21) Appl. No.: 11/850,988

(22) Filed: Sep. 6, 2007

(65) Prior Publication Data

US 2008/0068880 A1 Mar. 20, 2008

(30) Foreign Application Priority Data

Sep. 15, 2006 (KR) ........................ 10-2006-0089652

(51) Int. Cl.
*H01L 27/148* (2006.01)
(52) U.S. Cl. ................. 257/241; 257/E27.005
(58) Field of Classification Search .................. 257/241, 257/E27.005
See application file for complete search history.

(56) References Cited

U.S. PATENT DOCUMENTS

| 2003/0146515 | A1* | 8/2003 | Kajiyama | 257/758 |
| 2005/0068825 | A1* | 3/2005 | Kamijima | 365/202 |
| 2005/0078511 | A1 | 4/2005 | Parkin | |
| 2005/0153549 | A1 | 7/2005 | Cho | |
| 2006/0120132 | A1 | 6/2006 | Parkin | |
| 2007/0198618 | A1* | 8/2007 | Kim et al. | 708/130 |
| 2007/0262301 | A1* | 11/2007 | Cowburn et al. | 257/40 |
| 2007/0278603 | A1* | 12/2007 | Ochiai et al. | 257/421 |
| 2008/0100963 | A1* | 5/2008 | Lee et al. | 360/131 |
| 2008/0138661 | A1* | 6/2008 | Lim et al. | 428/827 |
| 2009/0273421 | A1* | 11/2009 | Cros et al. | 335/302 |

FOREIGN PATENT DOCUMENTS

| KR | 2001-325855 | 10/2001 |
| KR | 2003-291943 | 8/2003 |
| KR | 10-2006-0013476 | 2/2006 |

* cited by examiner

*Primary Examiner* — Kiesha Bryant
*Assistant Examiner* — Igwe U Anya
(74) *Attorney, Agent, or Firm* — Harness, Dickey & Pierce, P.L.C.

(57) ABSTRACT

Provided is a memory device employing magnetic domain wall movement. The memory device includes a writing track and a column structure. The writing track forms magnetic domains that have predetermined magnetization directions. The column structure is formed on the writing track and includes at least one interconnecting layer and at least one storage track.

15 Claims, 20 Drawing Sheets

MEMORY DEVICE EMPLOYING MAGNETIC DOMAIN WALL MOVEMENT

CROSS-REFERENCE TO RELATED PATENT APPLICATION

This application claims the benefit of Korean Patent Application No. 10-2006-0089652, filed on Sep. 15, 2006, in the Korean Intellectual Property Office, the disclosure of which is incorporated herein in its entirety by reference.

BACKGROUND OF THE INVENTION

1. Field of the Invention

The present invention relates to a memory device, and more particularly, to a memory device that employs the principle of moving magnetic domain walls of a magnetic material to write, record, and delete data.

2. Description of the Related Art

Due to developments in information technology leading to a requirement for high capacity data storage, demand for data storage media capable of storing large quantities of data continues to increase. Accordingly, data storage speed has been augmented, methods of compacting storage devices have been developed, and as a result, a wide variety of data storage devices has been developed. A widely-used data storage medium is a hard disk drive (HDD), which includes a read/write head and a rotating medium on which data is recorded, and has the capacity for recording 100 gigabytes (GB) of data or more. However, the rotating parts in storage devices such as HDDs have a tendency to wear, so that the reliability of such devices is compromised by the likelihood of a failure during operation after a prolonged period of use.

At present, research and development is underway on a new data storage device that uses a magnetic domain wall movement principle.

FIGS. 1A through 1C are perspective views illustrating a principle of moving a magnetic domain wall. Referring to FIG. 1A, a magnetic wire 10, which includes a first magnetic domain 11, a second magnetic domain 12, and a magnetic domain wall 13 between the first and second magnetic domains 11 and 12, is illustrated.

A magnetic micro region within a magnetic material will hereinafter be referred to as a magnetic domain. In such a magnetic domain, the rotation of electrons, that is, the direction of the magnetic moment of the electrons is the same. The size and magnetization direction of such a magnetic domain can be adjusted by altering the type of magnetic material, its shape and size, as well as applied external energy. A magnetic domain wall is a region on a magnetized material, which separates magnetic domains having different magnetization directions. Such a magnetic domain wall may be moved or propagated along the magnetized material by the application of a magnetic field or a current to a magnetic material.

As illustrated in FIG. 1A, after a plurality of magnetic domains disposed in predetermined directions are created in a magnetic layer with a predetermined width and thickness, the magnetic domains may be moved using magnetic fields or currents.

Referring to FIG. 1B, when a magnetic field is applied along the magnetic wire 10 in a direction from the second magnetic domain 12 to the first magnetic domain 11, the magnetic domain wall 13 may move in the same direction of the application of the external magnetic field, that is, in the direction from the second magnetic domain 12 toward the first magnetic domain 11. Using the same principle, when a magnetic field is applied in a direction from the first magnetic domain 11 to the second magnetic domain 12, the magnetic domain wall 13 moves toward the second magnetic domain 12.

Referring to FIG. 1C, when an external current is supplied in the direction from the first magnetic domain 11 to the second magnetic domain 12, the magnetic domain wall 13 moves toward the first magnetic domain 11. When a current is supplied, electrons flow in the opposite direction to the direction of the current, and the magnetic domain wall 13 moves in the same direction as the electrons. That is, the magnetic domain wall moves in the direction opposite to that of the externally supplied current. When a current is supplied in a direction from the second magnetic domain 12 to the first magnetic domain 11, the magnetic domain wall 13 moves toward the second magnetic domain 12.

In summary, a magnetic domain wall can be moved using an applied external magnetic field or current, which facilitates the movements of a magnetic domain.

The principle of moving magnetic domains may be applied to a memory device such as an HDD or a read only memory (RAM). Specifically, it is possible to perform an operation for reading/writing binary data of '0' and '1' by using the principle of changing the magnetic arrangement within a magnetic material by moving a magnetic domain wall of the magnetic material having magnetic domains magnetized in predetermined directions, wherein the magnetic domain wall represents the boundaries between the magnetic domains. When a current is applied to a linear magnetic material, the positions of the magnetic domain walls are changed to read and write data, rendering the fabrication of a highly integrated device with a simple structure. Therefore, the principle of moving a magnetic domain wall can be used to fabricate and use memory devices with much larger storage capacities than the conventional memories, such as ferroelectric random access memory (FRAM), magnetoresistive random access memory (MRAM), and phase-change random access memory (PRAM) devices. However, the application of the moving of magnetic domain walls to semiconductor devices is still in the early development stage, and the devices have a comparatively low data storage density. Therefore, there is a need for memory devices employing magnetic domain wall movement with structures optimized for high-density devices.

SUMMARY OF THE INVENTION

The present invention provides a memory device employing magnetic domain wall movement, that has a high density data recording capability, is structurally stable, and does not require physically moving parts, such as rotating a recording medium, thereby preventing wear and the occurrence of failures.

According to an aspect of the present invention, there is provided a memory device including a writing track layer provided with magnetic domains, which each are separated from a neighboring domain by a domain wall; and a stack of an interconnecting layer and a storage track layer, the storage track layer being provided with magnetic domains, each of which are separated from a neighboring domain by a domain wall, wherein the stack of the interconnecting layer and the storage track layer is formed on the writing track layer; wherein the interconnecting layer is formed of a magnetic material which has a lower magnetic anisotropy energy constant than that of the writing track layer and than that of the storage track layer; and wherein the domain wall moves along the writing track layer, the interconnecting layer and/or the storage track layer.

The interconnecting layer and the storage track layer may be alternately layered.

The storage track layer may be disposed in a direction parallel to, orthogonal to, or intersecting a disposed direction of the writing track layer.

The writing track layer and the storage track layer each may be formed in a single layer or a multilayer structure.

The storage track layer may have a length that is shorter than a length of the writing track layer.

The writing track layer and the storage track layer each may be formed of a magnetic material having a magnetic anisotropy energy constant value of between $10^5$ J/m$^3$ and $10^7$ J/m$^3$.

The writing track layer and the storage track layer each may be formed of a material including at least one of CoPt and FePt.

The writing track layer and the storage track layer each may be in the form of a wire or stripe. For example, the writing track layer and the storage track layer each may have a thicknesses of between 1 nm and 100 nm.

The writing track layer and the storage track layer may have respective widths of between 10 nm and 500 nm.

The interconnecting layer may be formed as a single layer or a multilayer.

The interconnecting layer may be formed of a magnetic material having a magnetic anisotropy energy constant of between $10^2$ J/m$^3$ and $10^3$ J/m$^3$.

The interconnecting layer may have a thickness of between 10 nm and 100 nm.

The interconnecting layer may be formed of at least one of NiFe and CoFe.

The stack may have a plurality of interconnecting layers and a plurality of storage track layers alternately layered, and a storage track layer formed farther from the writing track layer has a greater length than that of a storage track layer formed close to the writing track layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
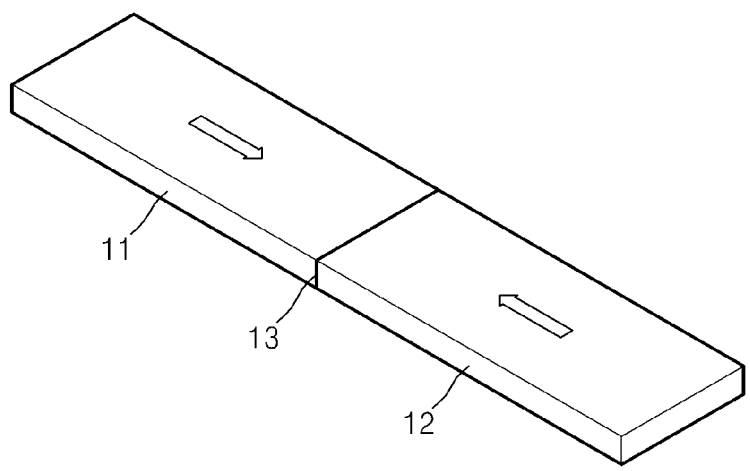
FIGS. 1A through 1C are perspective views illustrating the principle of moving a magnetic domain wall.
Figure 1B:
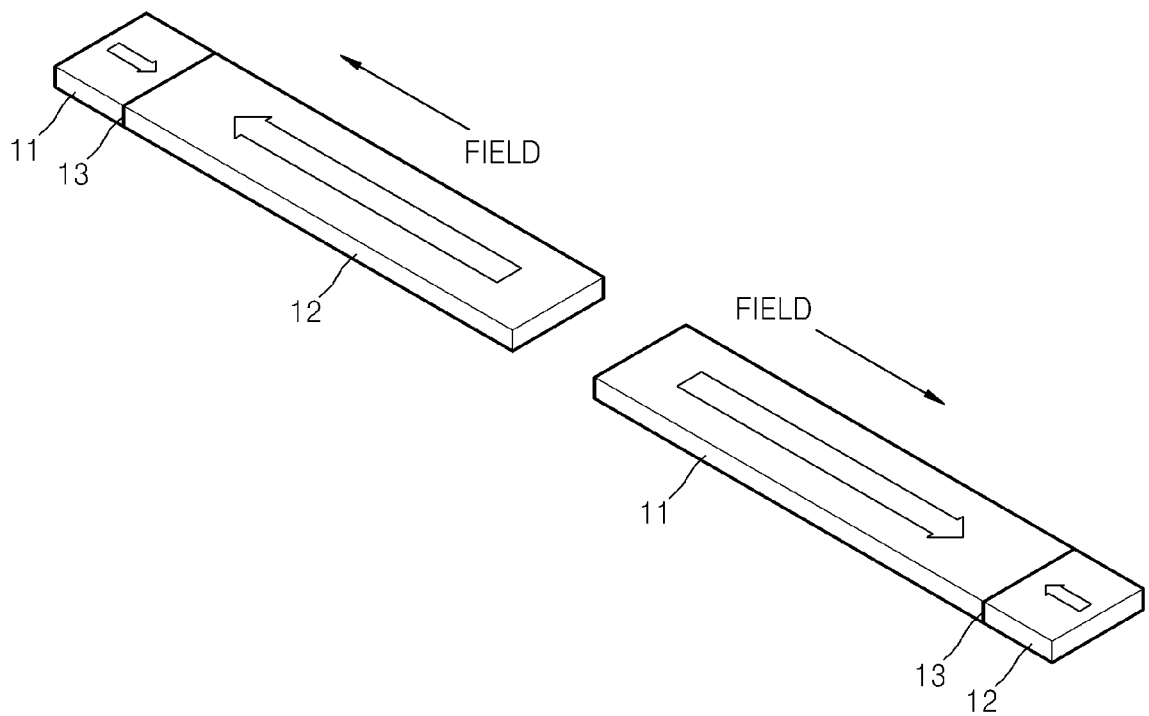
Figure 1C:
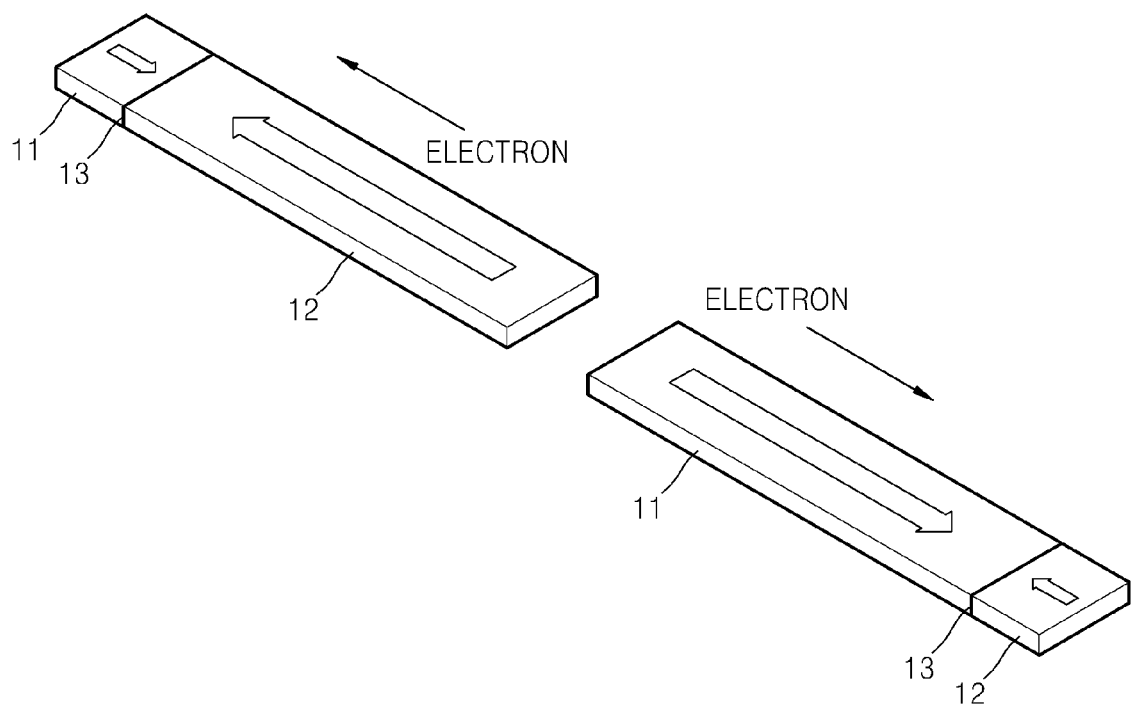

The memory device employing a magnetic domain wall movement according to the present invention will now be described more fully with reference to the accompanying drawings, in which exemplary embodiments of the invention are shown. In the drawings, the thicknesses and widths of layers are exaggerated for clarity.

The present invention provides a memory device including a writing track formed in a first direction, storage tracks formed in a second direction, and soft magnetic interconnecting layers formed between the writing track and the storage tracks and between the storage tracks.

Figure 2A:
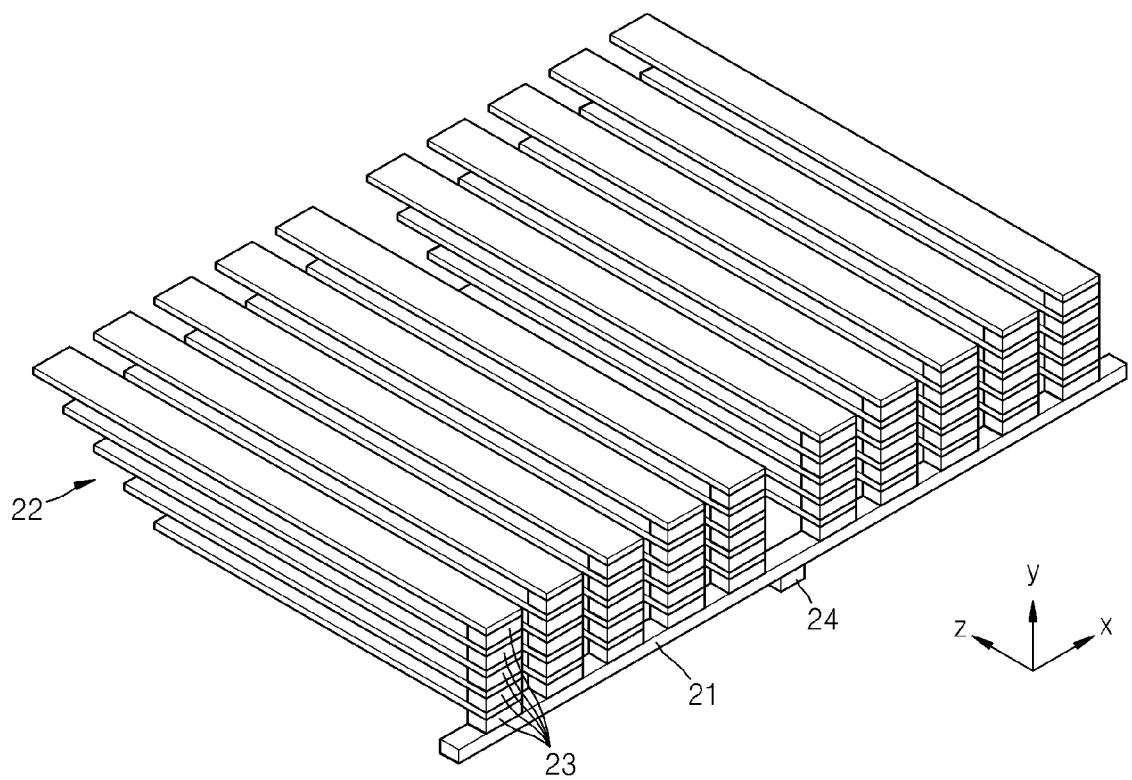
FIG. 2A is a perspective view of a memory device employing magnetic domain wall movement, according to an embodiment of the present invention.

FIG. 2A is a perspective view of a memory device employing magnetic domain wall movement, according to an embodiment of the present invention.

Referring to FIG. 2A, a memory device includes a layer formed with writing tracks (hereinafter "writing track" 21) disposed in a first direction, a plurality of layers each formed with storage tracks (hereinafter "storage tracks" 22) disposed in a second direction perpendicular to the writing track 21, and soft magnetic interconnecting layers 23 formed between the writing track 21 and a storage track 22, which is most close to the writing track 21 and between the respective storage tracks 22. Also, a magneto-resistance sensor 24 is formed on the bottom of the writing track 21. The magneto-resistance sensor 24 may alternatively be formed on the top of the writing track 21. The storage tracks 22 and the soft magnetic interconnecting layers 23 are alternately stacked on the writing track 21. A stack of the interconnecting layers 23 and storage tracks 22 formed on the same region of the writing track 21 defines a column structure.

FIG. 2A shows ten columns formed on the writing track 21 along the length direction of the writing track 21, where one column contains five storage tracks 22 in a stacked configuration. However, the number of columns on the writing track 21 is not limited thereto, and the number of storage tracks 22 included in each column is not restricted thereto.

Figure 2B:
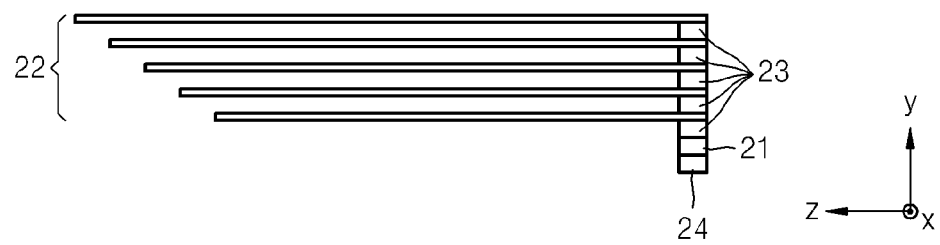
FIG. 2B is a side view of the memory device in FIG. 2A.

FIG. 2B is a side view of the memory device of FIG. 2A. Referring to FIG. 2B, the interconnecting layers 23 and the storage tracks 22 are alternately formed on the writing track 21. In the embodiment shown in FIG. 2B, there are five storage tracks 22 in a stack, and the storage tracks 22 are formed progressively longer in an upward direction, i.e., the storage tracks 22 formed higher in the stack (i.e., farther from the writing track 21) are longer than the tracks formed at lower portions of the stack (i.e., close to the writing track 21). The lengths of the storage tracks 22 may be formed differently in order to allow easy forming of electrodes (not shown) for applying current on the end of each storage track 22. If electrodes are formed to the side of the storage tracks 22, there are no restrictions imposed on the lengths of the storage tracks 22. In the present invention, the lengths of the storage tracks 22 may be shorter than the length of the writing track 21. The reason for this is that the data on the storage tracks 22 is recorded as "0" or "1" according to a spin direction of a magnetic domain. In order to read data, magnetic domains of the storage tracks 22 are moved to the writing track 21, to be read by the magneto-resistance sensor 24.

Figure 3A:
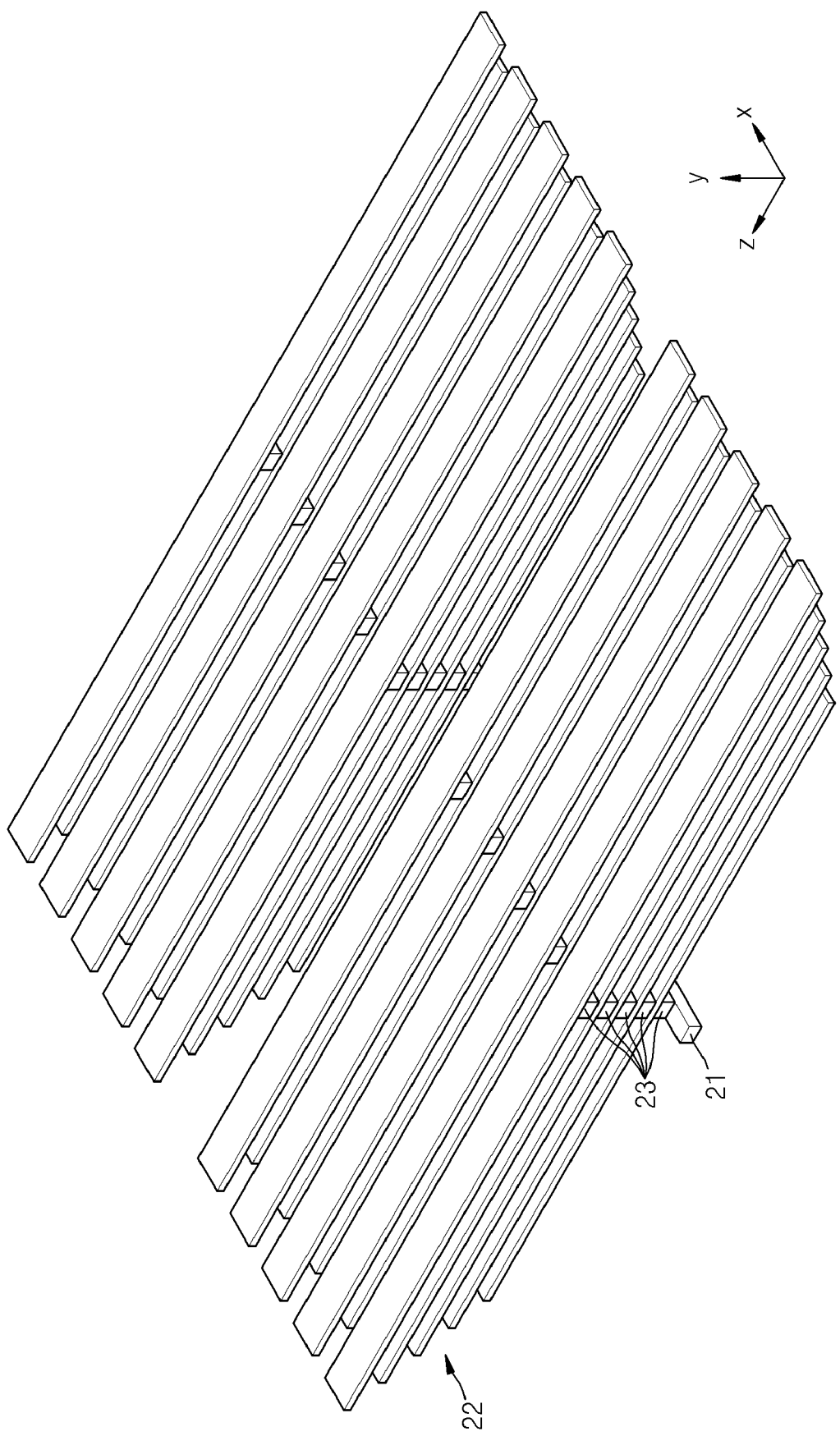
FIG. 3A is a perspective view of a memory device employing magnetic domain wall movement, according to another embodiment of the present invention.

FIG. 3A is a perspective view of a memory device employing magnetic domain wall movement, according to another embodiment of the present invention.

Referring to FIG. 3A, a writing track 21 is formed in a first direction, a plurality of storage tracks 22 are formed in a second direction perpendicular to the writing track 21, and interconnecting layers 23 are formed between the writing track 21 and the storage track 22, which is most close to the writing track 21, and between the respective storage tracks 22. A magnetic resistance sensor 24 is formed on the bottom of the writing track 21. Alternatively, the magnetic resistance sensor 24 may be formed on the top of the writing track 21. Similar to the structure illustrated FIG. 2A, the storage tracks 22 and interconnecting layers are alternatively stacked on the writing track 21 along the length direction of the writing track 21 (i.e., "x" direction in FIG. 2A). A stack of the interconnecting layers 23 and storage tracks 22 on the same region of the writing track 21 defines a column structure. While FIG. 2A illustrates an embodiment where an orthogonal structure is formed by the storage tracks 22 and the writing track 21, a cross structure is formed by the storage tracks 22 and the writing track 21 in the embodiment illustrated in FIG. 3A. A multiple number of stacks of the alternating storage tracks 22 and the interconnecting layers are formed along the length direction of the writing track 21.

Figure 3B:
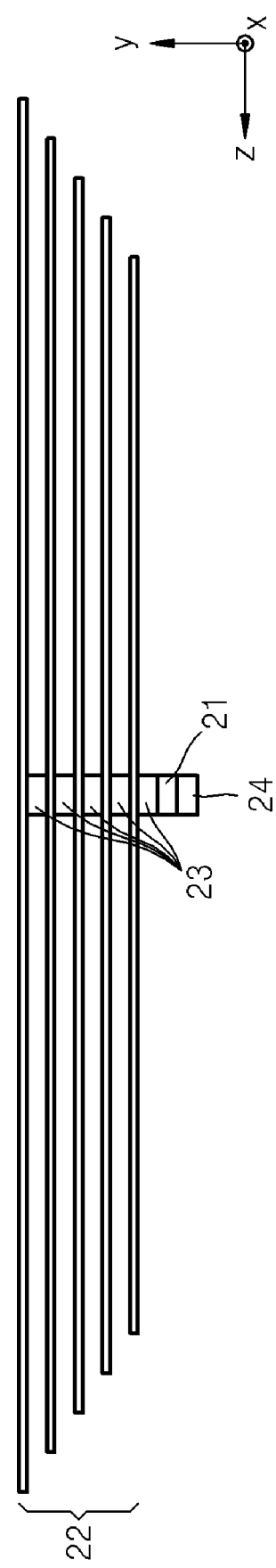
FIG. 3B is a side view of the memory device in FIG. 3A.

FIG. 3B is a side view of the memory device of FIG. 3A. Referring to FIG. 3B, the interconnecting layer 23 is formed between the writing track 21 and one of the storage tracks 22, which is most close to the writing track 21, and between the respective storage tracks 22. Like the structure illustrated in FIG. 2B, the storage tracks 22 are formed progressively longer in an upward direction. The lengths of the storage tracks 22 are different in order to allow easy forming of electrodes (not shown) for applying current to the tips of each storage track 22. If electrodes are formed to the side of the storage tracks 22, there are no restrictions imposed on the lengths of the storage tracks 22. In the present invention, the lengths of the storage tracks 22 may be shorter than the length of the writing track 21.

Hereinafter, a detailed description will be given of materials that form each layer of the memory device according to embodiments of the present invention.

The writing track 21 and the storage tracks 22 are formed of a material with high magnetic anisotropy energy characteristics. For example, they may be formed of a high Ku material with a magnetic anisotropy constant of $10^5$ J/m$^3$ or higher. In one embodiment, the material has a magnetic anisotropy constant ranging from between $10^5$ J/m$^3$ and $10^7$ J/m$^3$. Specifically, the material may be CoPt or FePt, having perpendicular magnetic characteristics, or an alloy including the same. The writing track 21 and the storage tracks 23 may be formed in single or multi-layered configurations. When formed in a multilayer configuration, a first layer may be formed of MgO, $B_2O_3$, Ag, or C, and a second layer thereabove may be formed of CoPt or FePt, after which the first and second layers are alternately stacked. The width and thickness of the writing track 21 and the storage tracks 22 may be adjusted according to the environment in which they are used, and are not extensively restricted. For example, the width may be between 10 nm and 500 nm, and the thickness may be from 1 to 100 nm.

The interconnecting layer 23 may be formed of a low Ku material with a magnetic anisotropy characteristic that is lower than those of the writing track 21 and writing track 22, and may be formed in single or multi-layered configurations. When the interconnecting layer 23 is formed of a material with a magnetic anisotropy constant lower than $10^3$ J/m$^3$, it may be formed of a material having a magnetic anisotropy constant of between $10^2$ J/m$^3$ and $10^3$ J/m$^3$. Specific examples of such a material include, but are not limited to, NiFe and CoFe. The thickness of the interconnecting layer 23 is not particularly limited and, in one embodiment, it may be between 10 nm and 100 nm.

The magneto-resistance sensor 24 may be a conventional giant magneto-resistance (GMR) sensor or a tunneling magneto-resistance (TMR) sensor that are used in memory devices such as HDDs.

Hereinafter, the operating principles, that is, the data writing and reading process in a memory device employing magnetic domain wall movement according to embodiments of the present invention will be described.

FIGS. 4A through 4H are perspective views illustrating a data writing method in a memory device employing magnetic domain wall movement, according to embodiments of the present invention.

Figure 4A:
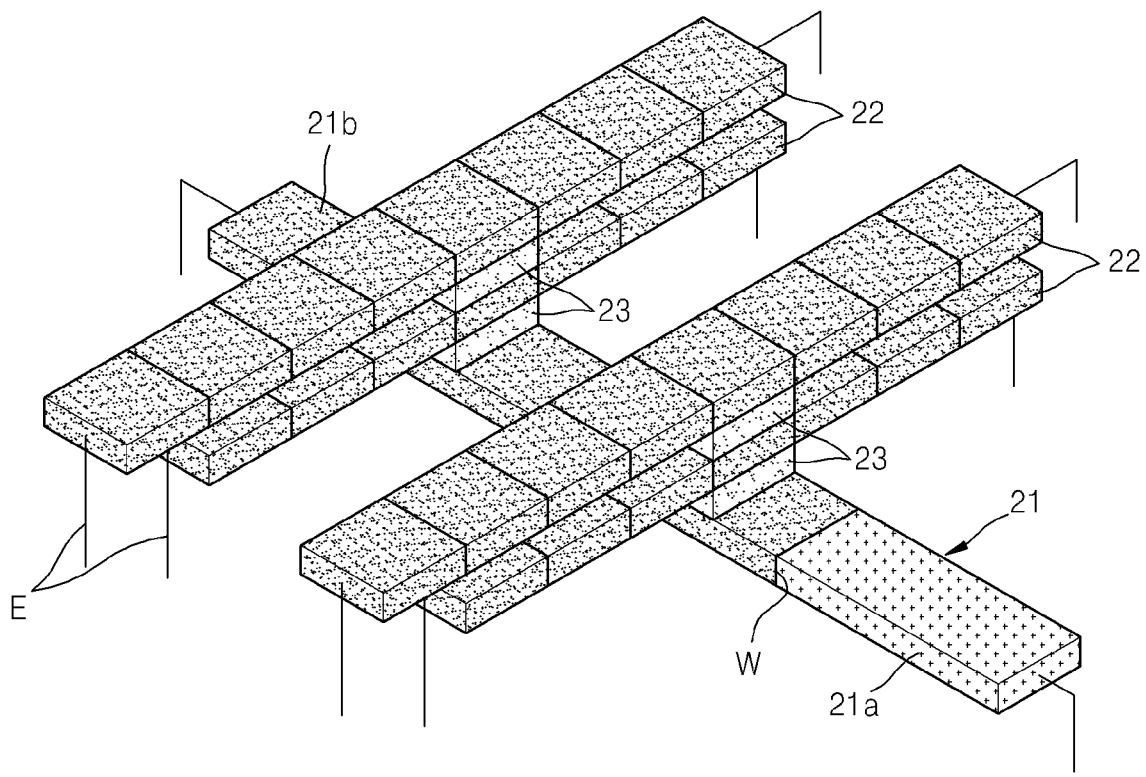
FIGS. 4A through 4H are perspective views illustrating a data writing method in a memory device employing magnetic domain wall movement, according to an embodiment of the present invention.

Referring to FIG. 4A, two stacks of the storage tracks 22, crossing a writing track 21, are formed on the writing track 21 along the length direction of the writing track 21. Interconnecting layers 23 are formed between the writing track 21 and one of the storage tracks 22, which is closest to the writing track 21 and between the respective storage tracks 22. In FIG. 4A, two columns of two storage tracks 22 and two interconnecting layers 23, each alternately formed on the writing track 21, are shown. Both ends of the writing track 21 and the ends of the storage tracks 22 have electrodes E formed thereon for applying currents thereto. The writing track 21 has a first magnetic domain 21a and a second magnetic domain 21b, each having opposite magnetizations, and a magnetic domain wall W at the boundary between the first and second magnetic domains 21a and 21b. The magnetization of the first magnetic domain 21a is in an upward direction, and the magnetization of the second magnetic domain 21b is in a downward direction, or vice versa, to represent data as "0" and "1", respectively.

Figure 4B:
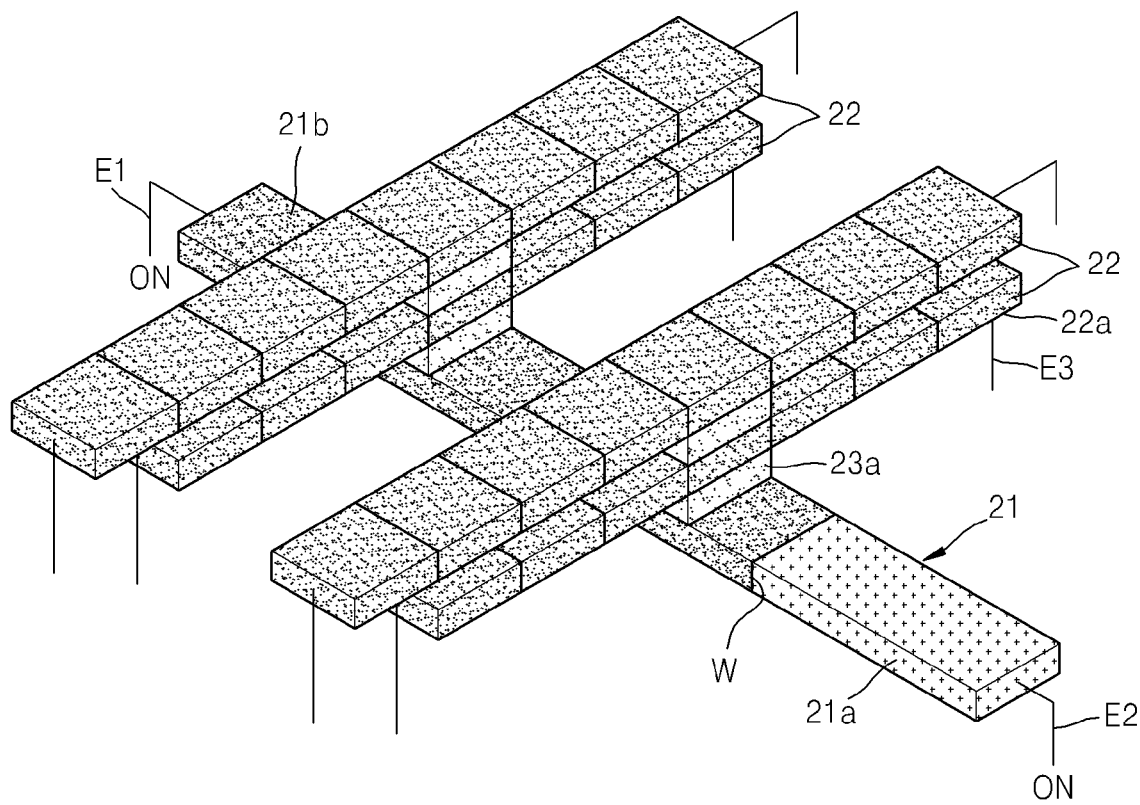

Referring to FIG. 4B, a track is selected from the storage tracks 22, on which data will be written. For example, storage track 22a is selected, which will hereinafter be referred to as first data storage track 22a. In order to magnetize the first data storage track 22a to have a same magnetic direction as that of the first magnetic domain 21a, electrodes E1 and E2 on either end of the writing track 21 are switched ON. The electrode E3 of the first data storage track 22a is turned OFF.

Figure 4C:
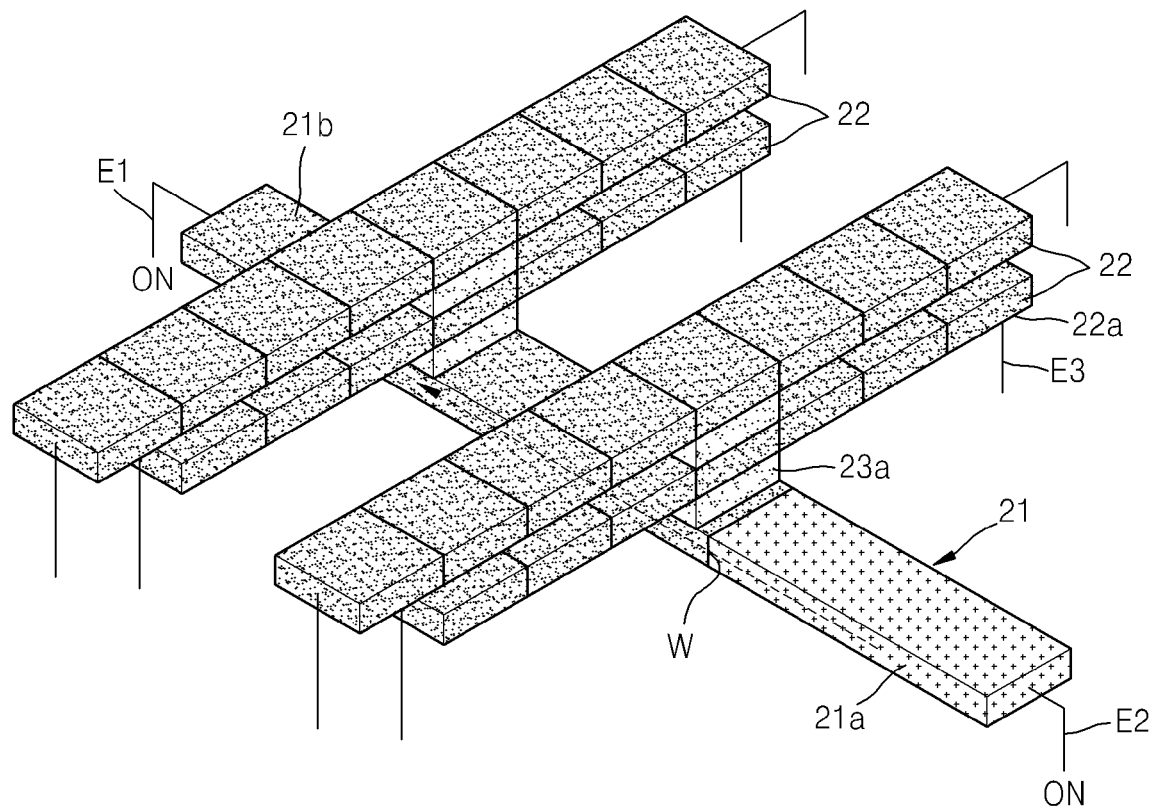

Referring to FIG. 4C, a current is supplied from the electrode E1 towards the electrode E2, and as such electrons flow in a direction from the electrode E2 towards the electrode E1, as indicated by an arrow. Accordingly, the magnetic domain wall W between the first magnetic domain 21a and the second magnetic domains 21b moves according to the flow of electrons from the electrode E2 to the electrode E1.

Figure 4D:
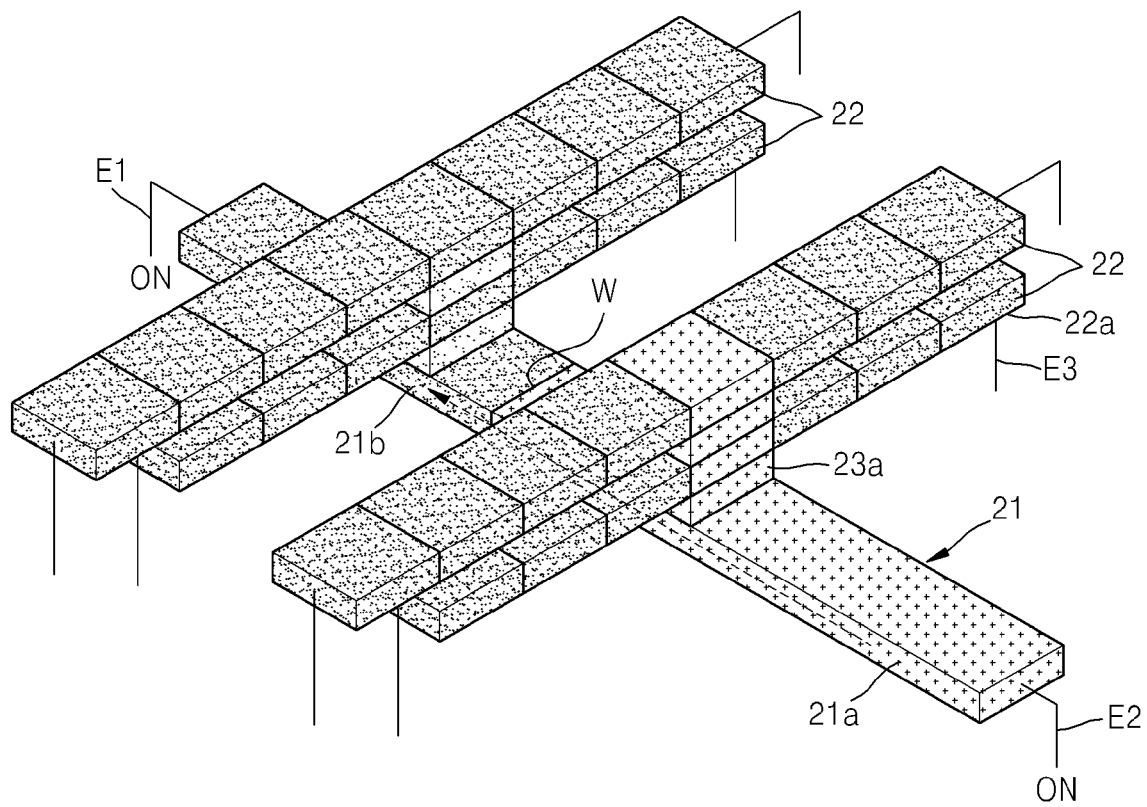

Referring to FIG. 4D, a voltage is continuously applied between the electrode E1 and the electrode E2 until the magnetic domain wall W between the first and second magnetic domains 21a and 21b passes the interconnecting layer 23a between the first storage track 22a and the writing track 21. The movement of the magnetic domain wall W toward the second magnetic domain 21b results in expanding the first magnetic domain 21a to cover the region of the writing tract 21 where the interconnecting layer 23a is formed thereon. Then, the interconnecting layer 23a adopts the same magnetization direction as the first magnetic domain 21a.

Figure 4E:
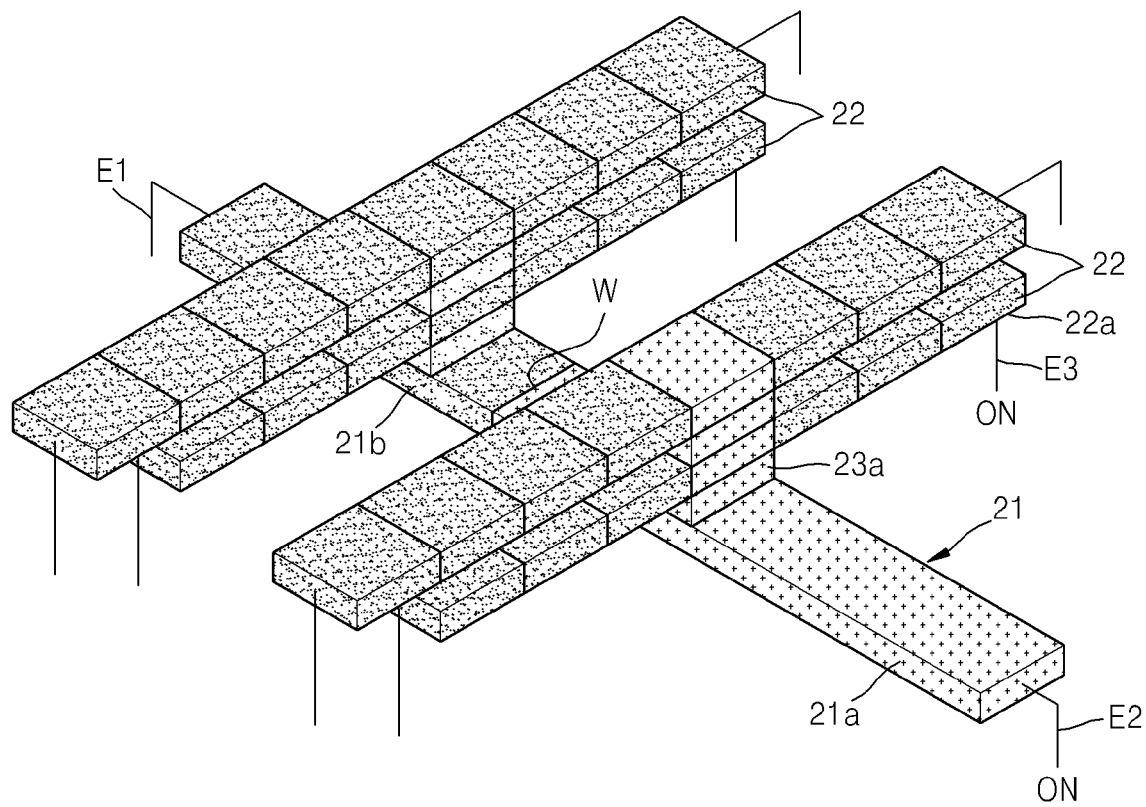
Figure 4F:
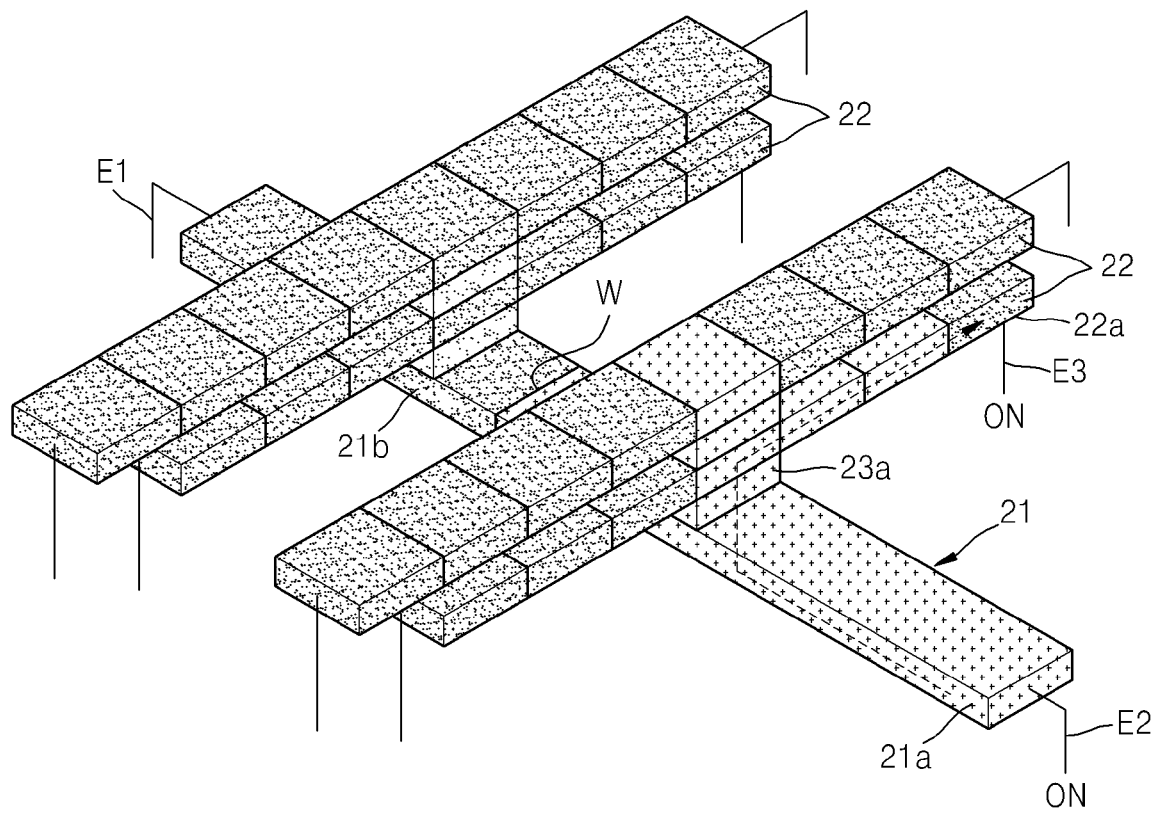

Referring to FIG. 4E, the electrode E1 is turned OFF, and the electrodes E2 and E3 are turned ON. Referring to FIG. 4F, a current is supplied from electrode E3 toward electrode E2. The electrons flow from electrode E2 towards electrode E3, and thus, the first magnetic domain 21a passes through the interconnecting layer 23a and expands toward the first storage track 22a.

Next, a description of the process of forming a magnetic domain with the same magnetization direction as the second magnetic domain 21b of the writing track 21 on the first storage track 22a will be given.

Figure 4G:
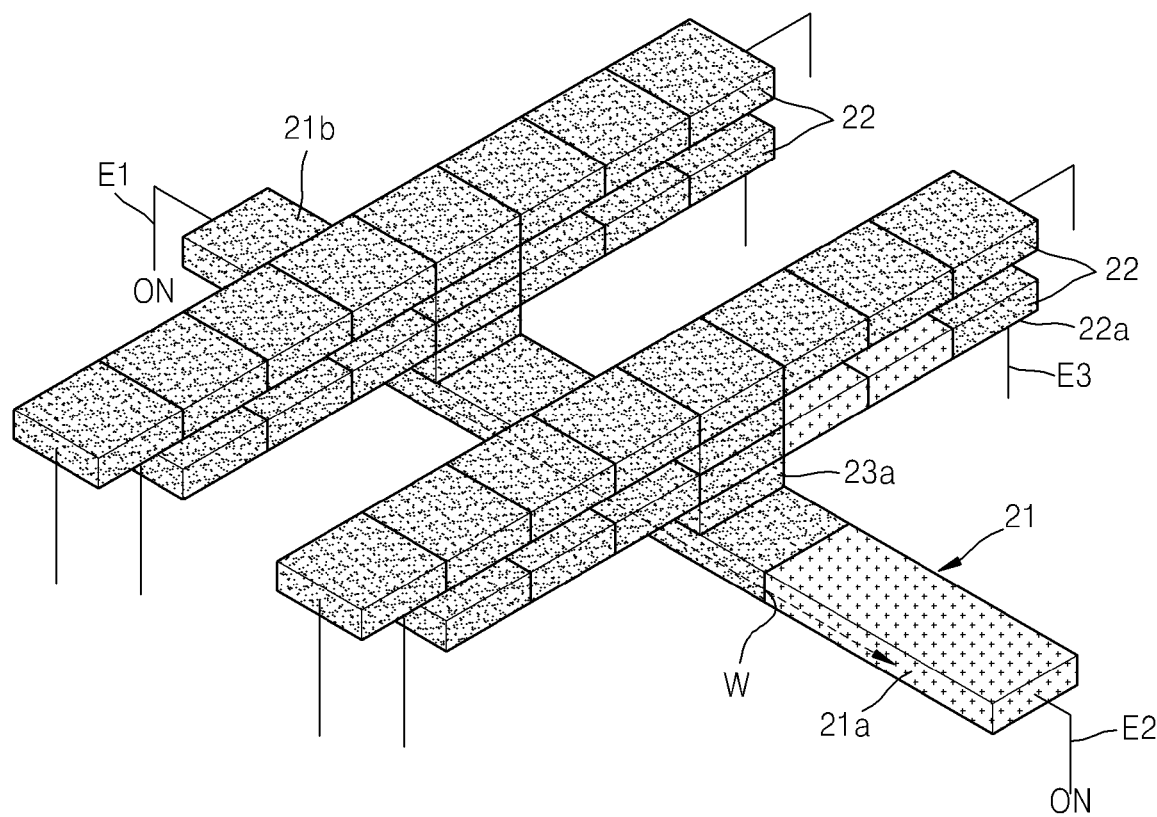

Referring to FIG. 4G, electrodes E1 and E2 are turned ON, and a current is supplied from electrode E2 toward electrode E1. Accordingly, electrons flow from electrode E1 to electrode E2, as indicated by an arrow, and the magnetic domain wall W between the second magnetic domain 21b and the first magnetic domain 21a of the writing track 21 moves toward electrode E2. A voltage is applied until the second magnetic domain 21b expands to cover the region of the writing track 21 where the interconnecting layer 23a is formed on. That makes the interconnecting layer 23a to adopt the same magnetization direction as the second magnetic domain 21b.

Figure 4H:
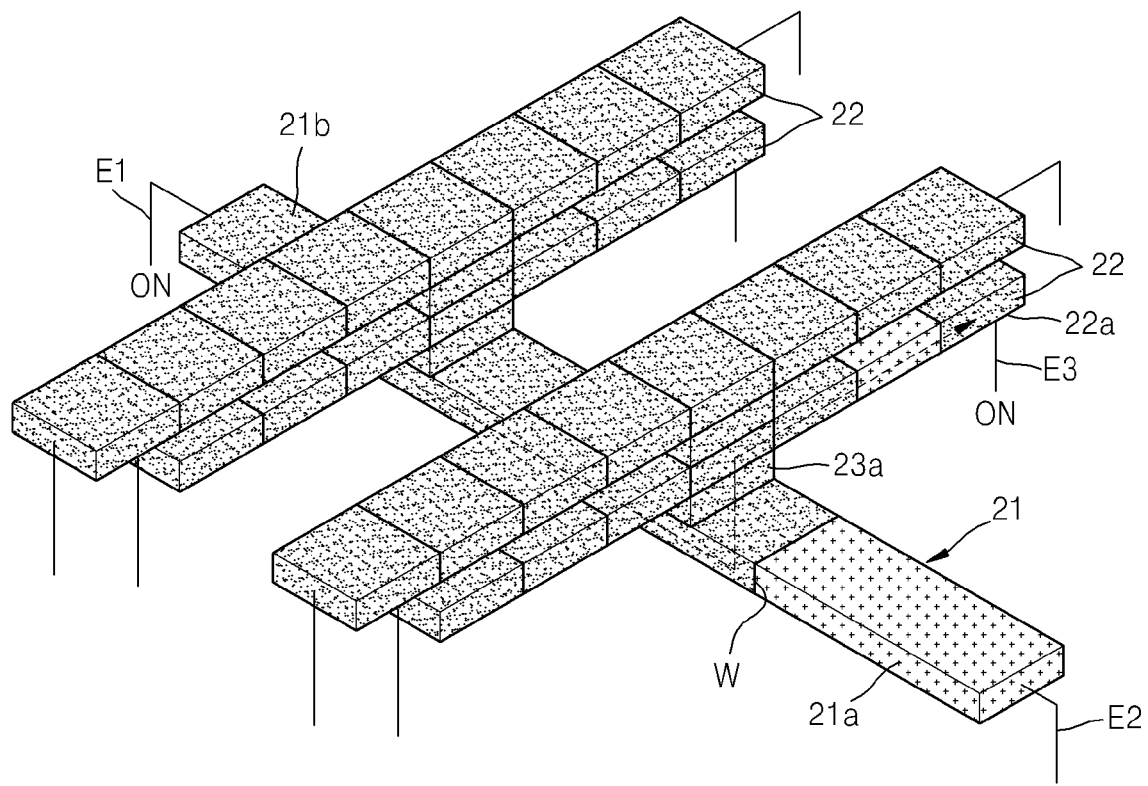

Referring to FIG. 4H, electrodes E1 and E3 are turned ON, and electrode E2 is turned OFF. A current is supplied from electrode E3 to electrode E1, so that electrons flow from electrode E1 toward electrode E3, and the second magnetic domain 21b of the writing track 21 extends through the interconnecting layer 23a and toward the first storage track 22a. As a result, a magnetic domain having the same magnetization direction as the second magnetic domain 21b is formed on the first storage track 22a.

The above-described method can be used to form a magnetic domain with a predetermined magnetization direction on a targeted region of the storage tracks 22, which indicates that data can be stored.

FIGS. 5A through 5G are side views illustrating a data reading method in a memory device employing magnetic domain wall movements, according to embodiments of the present invention.

Figure 5A:
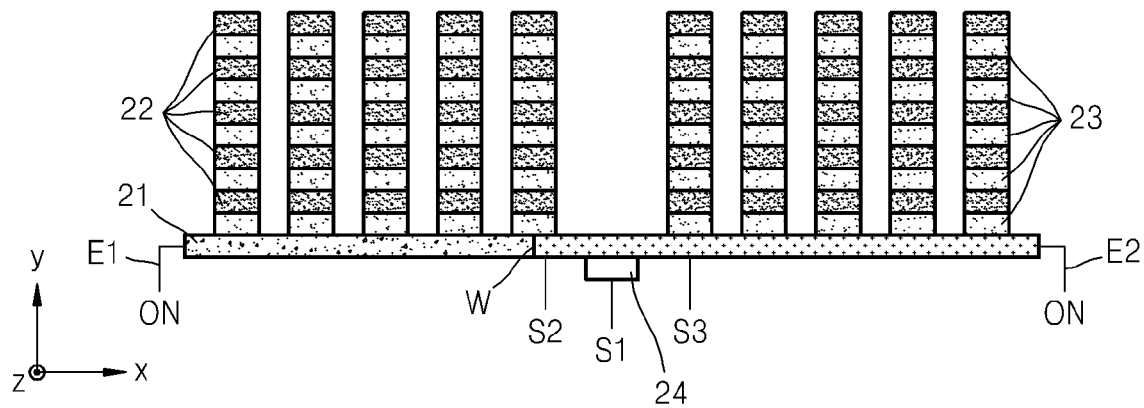
FIGS. 5A through 5G are side views illustrating a data reading method in a memory device employing magnetic domain wall movement, according to an embodiment of the present invention.

Referring to FIG. 5A, stacks of storage tracks 22 are formed in columns on a writing track 21 to cross the writing track 21 along the length direction of the writing track 21. Interconnecting layers 23 are formed between the writing track 21 and one of the storage tracks 22, which is placed closest to the writing track 21 and between the respective storage tracks 22. A magneto-resistance sensor 24 is formed on the bottom of the writing track 21. FIG. 5A shows ten columns, each of which contains five storage tracks 22. An electrode S1 for reading the resistance value of the magneto-resistance sensor 24 is formed on the magneto-resistance sensor 24, and electrodes S2 and S3 for applying a current to the writing track 21 are formed on the writing track 21 at both flanks of the magneto-resistance sensor 24.

Figure 5B:
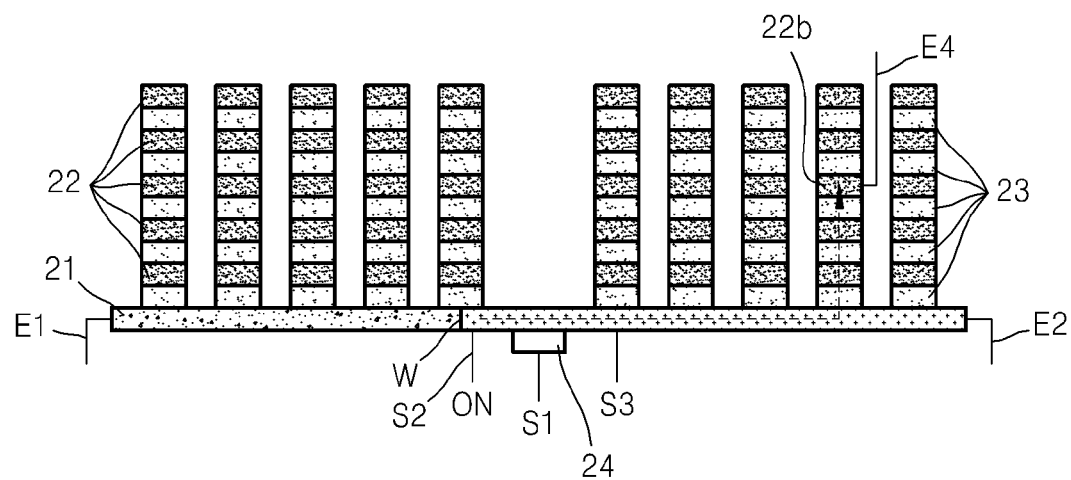

First, a storage track 22 is selected for reading data. Referring to FIGS. 5A and 5B, when a second storage track 22b on the right side of the writing track 21 is selected, a current is supplied from an electrode E1 towards an electrode E2. Two magnetic domains of opposite magnetization directions are formed on the writing track 21, and a current is supplied from electrode E1 toward electrode E2 until a magnetic domain wall W, which moves toward electrode E1, passes electrode S2. The reason for moving the magnetic domain wall W to pass the electrode S2 toward electrode E1 is to preserve magnetic domains formed during the writing process that have opposite magnetization directions in the writing track 21.

Figure 5C:
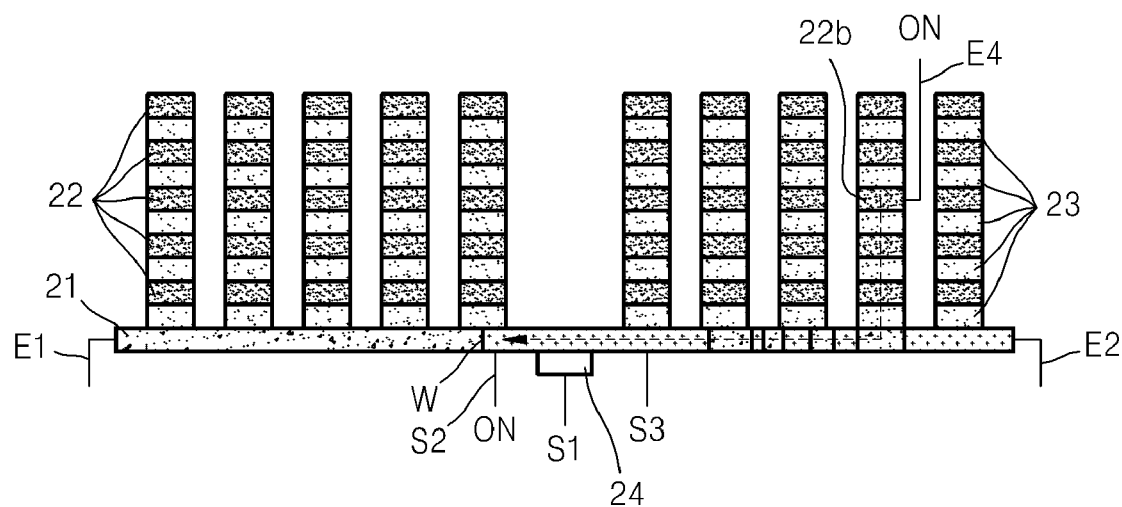
Figure 5D:
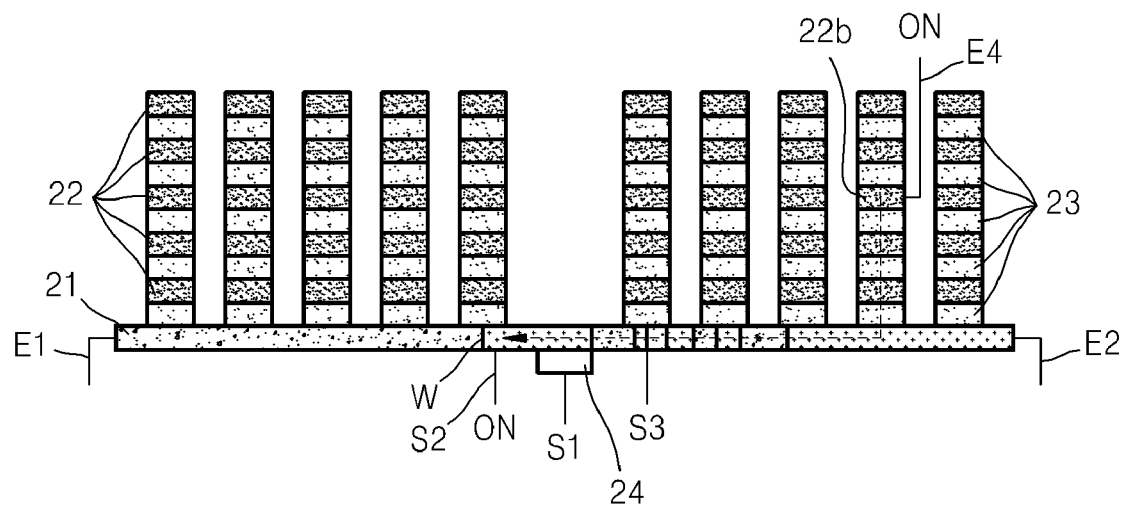

Referring to FIGS. 5B through 5D, an electrode E4 formed on the end of the second storage track 22b and an electrode S2 are turned ON. A voltage is then applied between the electrode S2 and the electrode E4. When a current flows from the electrode S2 towards the electrode E4, the electrons flow in the direction from electrode E4 to the electrode S2. Accordingly, the magnetic domains of the second storage track 22b pass through the interconnecting layers 23 and move toward the writing layer 21. Because current does not flow from the electrode E1 of the writing track 21 to the electrode S2, there is no change in the magnetic domains located between the electrodes E1 and S2. Accordingly, there is no change in the position of magnetic domain wall W of the writing track 21 in FIGS. 5A-5D.

Figure 5E:
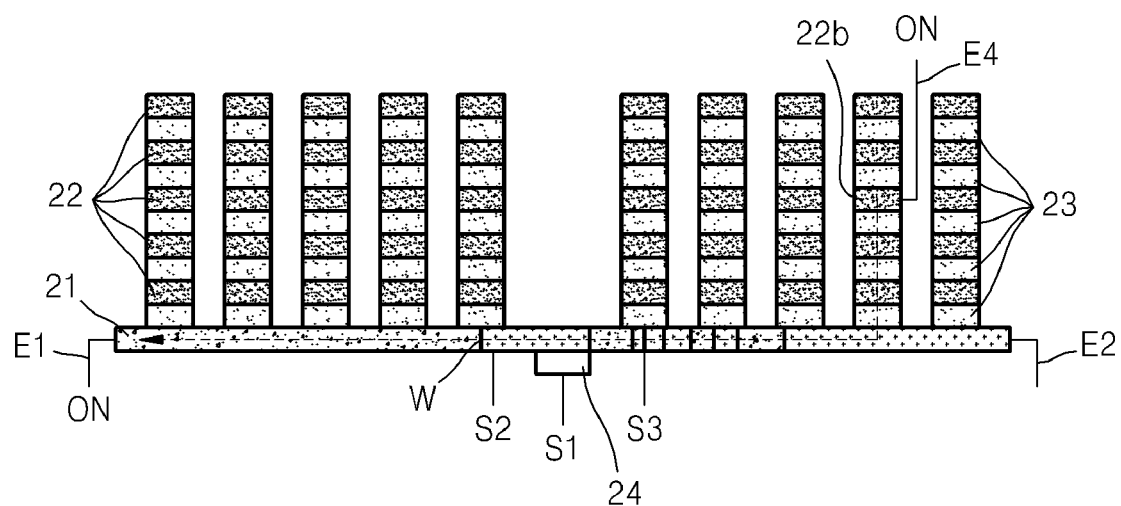
Figure 5F:
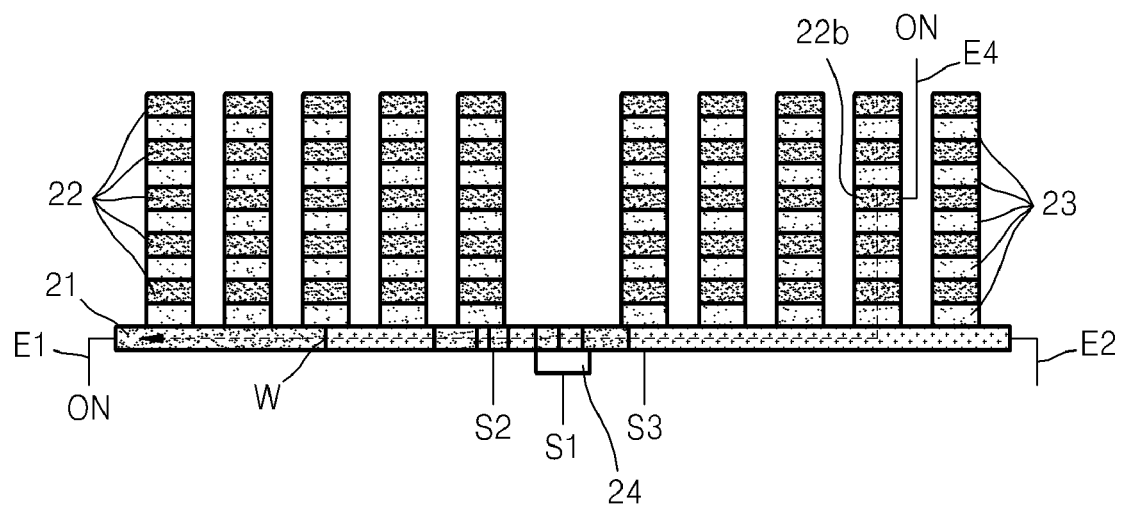

Referring to FIGS. 5E and 5F, when the magnetic domains of the second storage track 22b approach the magneto-resistance sensor 24, the electrode S2 is switched OFF and the electrode E1 is switched ON. Then a current is supplied from electrode E1 toward electrode E4. Accordingly, electrons flow from electrode E4 toward electrode E1, and the magnetic domains between electrodes E1 and E4 move toward electrode E1. As the magnetic domains pass the magneto-resistance sensor 24, the resistance variation of the magneto-resistance sensor 24 according to the magnetization directions of the magnetic domains are read through the electrode S1, thus data can be read from the second storage track 22b.

Figure 5G:
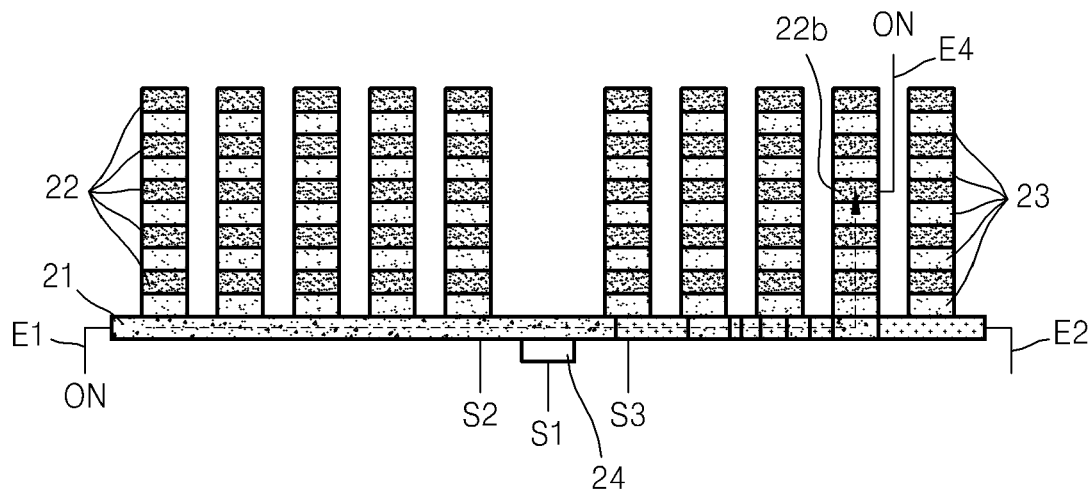

Finally, referring to FIG. 5G, by applying a voltage so that a current flow from electrode E4 toward electrode E1, the magnetic domains are moved from the writing track 21 toward the second storage track 22b. Also, when the processes illustrated in FIGS. 5A through 5F is reversed, the original state is restored, and the reading process is completed.

FIGS. 6A through 6E are views illustrating the principle of data reading in a memory device employing magnetic domain wall movements, according to embodiments of the present invention. In FIGS. 5A through 5G, a process of reading data from a storing track 22 located to the right of a magneto-resistance sensor 24 of a writing track 21 was illustrated. Here, a process of reading data on a storing track 22 located to the left of the magneto resistance sensor 24 will be described.

Figure 6A:
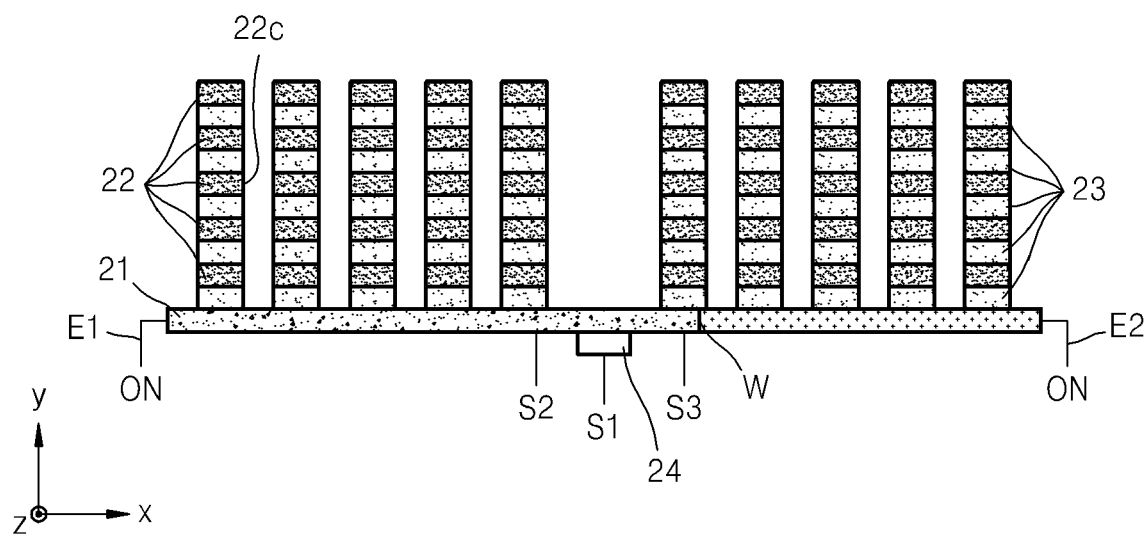
FIGS. 6A through 6E are side views illustrating the principle of data reading in a memory device employing magnetic domain wall movement, according to an embodiment of the present invention.

Referring to FIG. 6A, in order to read data written on a third storage track 22c, which is formed to the left of the magneto-resistance sensor 24 of the writing track 21, the electrode E1 and the electrode E2 are turned ON, and a current is supplied from the electrode E2 toward the electrode E1. A magnetic domain wall W at a boundary of two magnetic domains of opposite magnetization directions formed on the writing track 21 moves toward the electrode E2, and the current is supplied until the magnetic domain wall W moves to the right of the electrode S3.

Figure 6B:
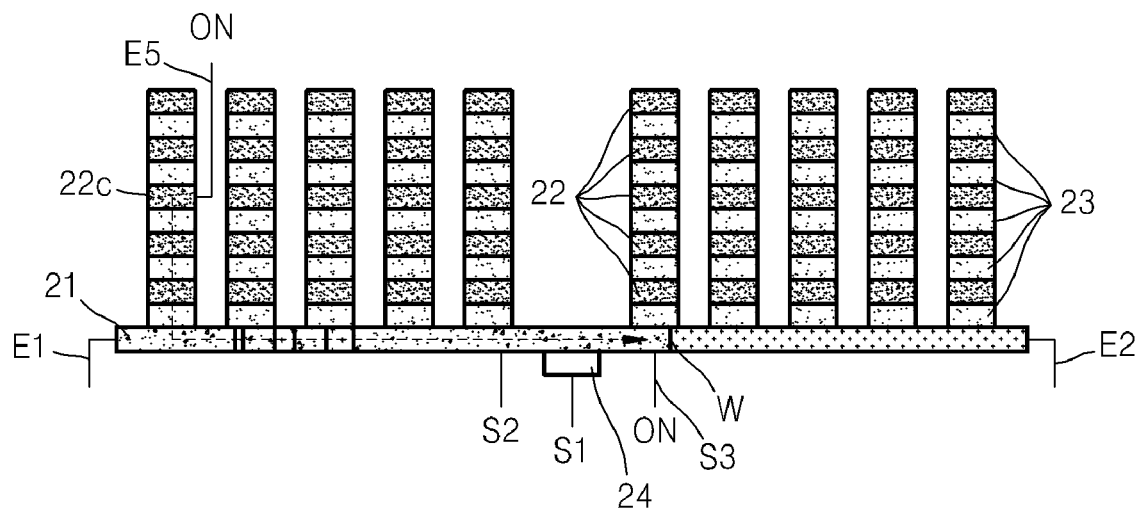
Figure 6C:
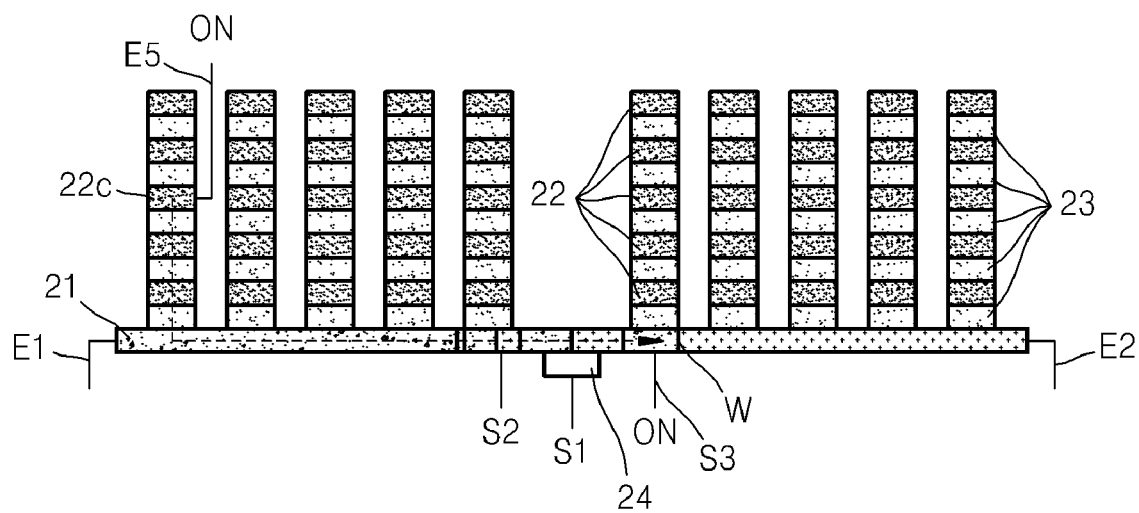

Referring to FIGS. 6B and 6C, the electrode S3 and the electrode E5 formed on the end of the third storage track 22c are turned ON. Then, a current is supplied from the electrode S3 toward the electrode E5. When the current flows from electrode S3 toward electrode E5, electrons flow from the electrode E5 towards the electrode S3. Therefore, the magnetic domains of the third storage track 22c pass through the interconnecting layer 23 and move toward the writing track 21. Because current does not flow from the electrode S3 of the writing track 21 to the electrode E2, there are no changes in the magnetic domains between electrodes S3 and E2, so that there is no positional change of the magnetic domain wall W of the writing track 21.

Figure 6D:
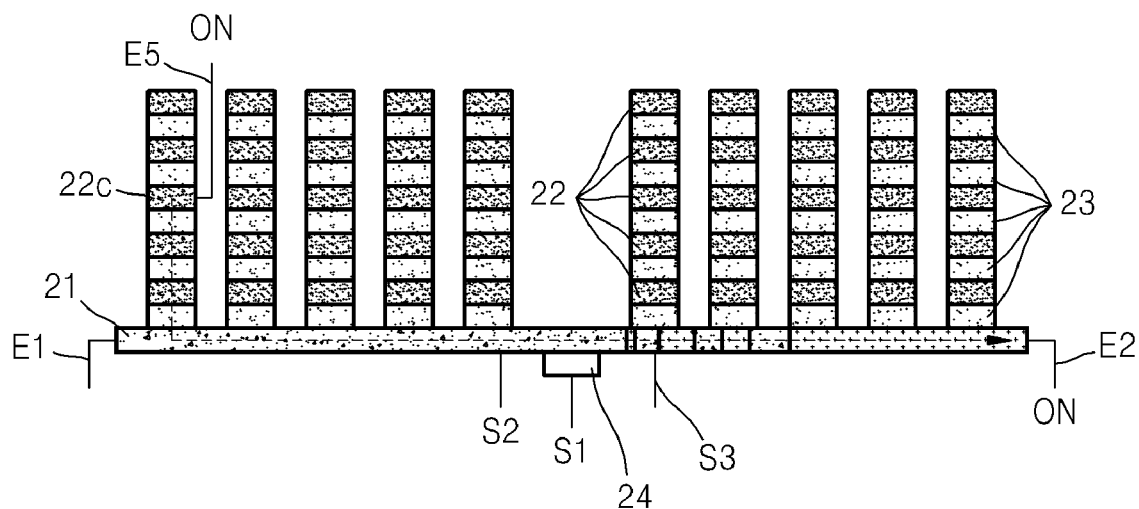

Referring to FIG. 6D, when the magnetic domains of the third storage track 22c reach the position of the magnetic resistance sensor 24, the electrode S3 is turned OFF and the electrode E2 is turned ON. Also, a current is supplied in a direction from the electrode E2 toward the electrode E5. Thus, electrons move in a direction from the electrode E5 toward the electrode E2, and the magnetic domains between the electrode E5 and the electrode E2 move toward the electrode E2. As the magnetic domains of the third storage track 22c move along the writing track 21 above the magneto-resistance sensor 24, the change in resistance of the magneto-resistance sensor 24 according to magnetization directions of the magnetic domains is detected by the electrode S1.

Figure 6E:
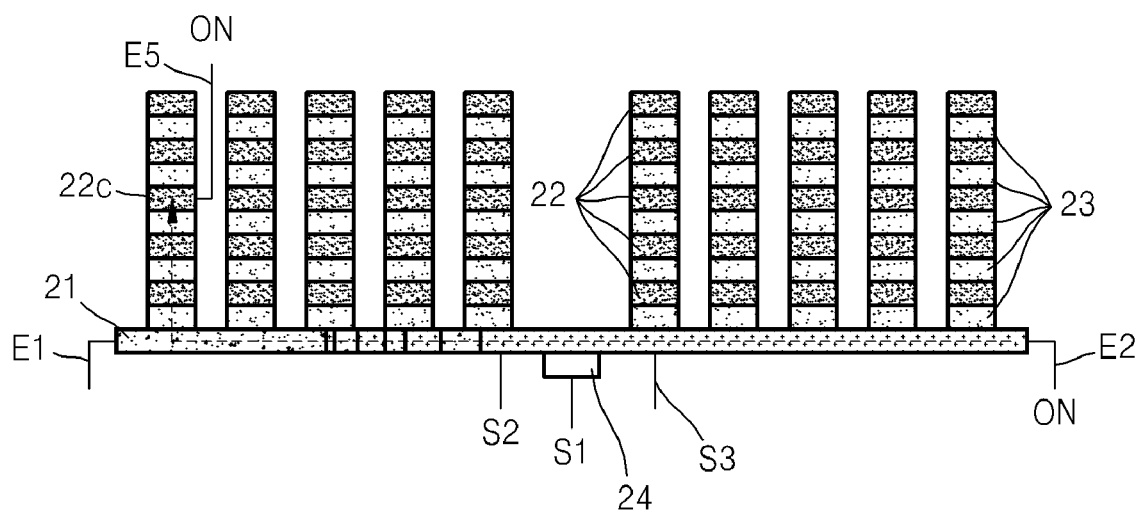

Finally, referring to FIG. 6E, by applying a voltage to flow a current from electrode E5 towards electrode E2, the magnetic domains are moved from the writing track 21 toward the third storage track 22c. Also, when the processes illustrated in FIGS. 6A through 6D are reversed, the magnetic domains can be restored to their original states.

As described above, a memory device employing magnetic domain wall movements according to embodiments of the present invention does not have components that physically move during the writing, reading and deleting of data. Only currents flow. Specifically, unlike conventional magnetic recording system containing magnetic heads which are prone to wear or failure, the memory device employing magnetic domain wall movements according to embodiments of the present invention does not use physically moving components that are prone to wear or failure.

Figure 7:
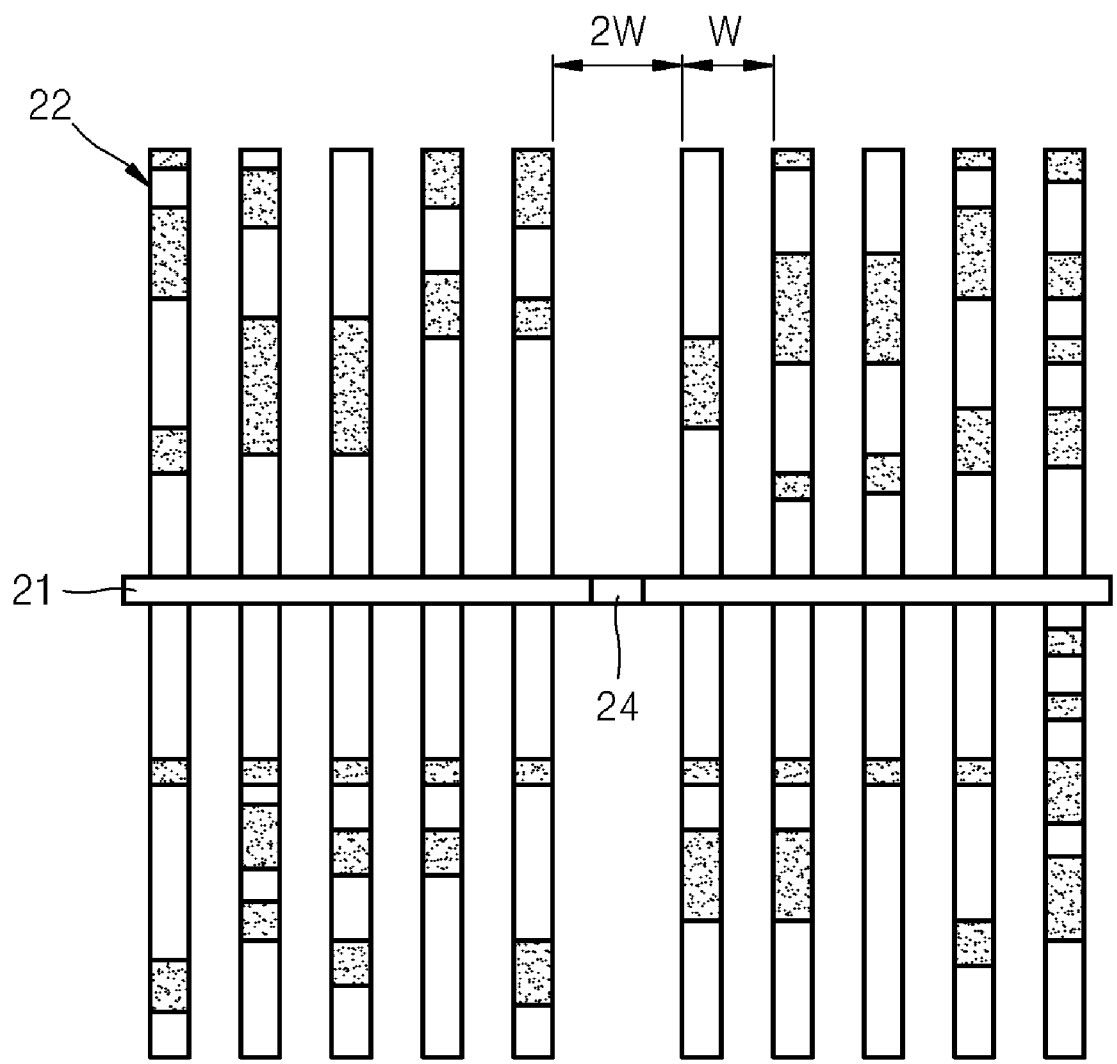
FIG. 7 is an example of a design of a memory device employing magnetic domain wall movement, according to an embodiment of the present invention.

FIG. 7 is an example of a design of a memory device employing magnetic domain wall movements, according to an embodiment of the present invention. Referring to FIG. 7, the magneto-resistance sensor 24 is formed in the central portion of the writing track 21, such that the storage tracks are symmetrically arranged along the length direction of the writing track 21 with respect to the magneto-resistance sensor 24 in the center. Such a configuration is just one exemplary design, and embodiments are not limited thereto. As described above, the locations of the columns on the writing track 21, the number of columns, and the number of storage tracks 22 formed in one column are not restricted and may be varied.

The present invention includes the following advantages.

First, when operating a memory device, unlike in an HDD, components are not mechanically or physically moved or placed in contact, while recording and reading of data is performed. Therefore, mechanical wear does not occur, and the device is appropriate for application in mobile devices. The memory device may be made into a miniature, high-density device capable of storing data in a density of terabits/in$^2$.

Second, the simple configuration of the product makes mass production and reproduction feasible.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, the memory device according to the present invention may be a storage device such as a semiconductor device with an added read/write head such as an HDD, a memory device further including a read/write electrode such as a RAM, or a logic device, as required. Therefore, the scope of the invention is defined not by the detailed description of the invention but by the appended claims, and all differences within the scope will be construed as being included in the present invention.

What is claimed is:

1. A memory device comprising:
   a writing track layer provided with magnetic domains, which each are separated from a neighboring domain by a domain wall; and
   a stack of an interconnecting layer and a storage track layer, the storage track layer being provided with magnetic domains, each of which are separated from a neighboring domain by a domain wall,
   wherein the writing track layer and the storage track layer each have a part extending from the interconnecting layer, the part being not in contact with the interconnecting layer
   the stack of the interconnecting layer and the storage track layer is formed on the writing track layer;
   wherein the interconnecting layer is formed of a magnetic material which has a lower magnetic anisotropy energy constant than that of the writing track layer and than that of the storage track layer; and
   wherein the domain wall moves along the writing track layer, the interconnecting layer and/or the storage track layer, by an application of a magnetic field or a current.

2. The memory device of claim 1, wherein the interconnecting layer and the storage track layer are alternately layered.

3. The memory device of claim 1, wherein the storage track layer is disposed in a direction parallel to, orthogonal to, or intersecting a direction in which the writing track layer is disposed.

4. The memory device of claim 1, wherein the writing track layer and the storage track layer each are formed in a single layer structure or a multilayer structure.

5. The memory device of claim 1, wherein the storage track layer has a length that is shorter than a length of the writing track layer.

6. The memory device of claim 1, wherein the writing track layer and the storage track layer each are formed of a magnetic material having a magnetic anisotropy energy constant value of between $10^5$ J/m$^3$ and $10^7$ J/m$^3$.

7. The memory device of claim 1, wherein the writing track layer and the storage track layer are formed of a material including at least one of CoPt and FePt.

8. The memory device of claim 1, wherein the writing track layer and the storage track layer each have a thickness of between 1 nm and 100 nm.

9. The memory device of claim 1, wherein the writing track layer and the storage track layer each have a width of between 10 nm and 500 nm.

10. The memory device of claim 1, wherein the interconnecting layer is formed as a single layer structure or a multilayer structure.

11. The memory device of claim 1, wherein the interconnecting layer is formed of a magnetic material having a magnetic anisotropy energy constant of between $10^2$ J/m$^3$ and $10^3$ J/m$^3$.

12. The memory device of claim 1, wherein the interconnecting layer has a thickness of between 10 nm and 100 nm.

13. The memory device of claim 1, wherein the interconnecting layer is formed of at least one of NiFe and CoFe.

14. The memory device of claim 1, further comprising a magnetic resistance sensor formed on the writing track layer.

15. The memory device of claim 1, wherein the stack has a plurality of interconnecting layers and a plurality of storage track layers alternately layered, and a storage track layer formed farther from the writing track layer has a greater length than that of a storage track layer formed close to the writing track layer.

* * * * *